United States Patent
Chen et al.

(10) Patent No.: US 11,177,812 B2
(45) Date of Patent: Nov. 16, 2021

(54) CLOCK AND DATA RECOVERY CIRCUIT AND FREQUENCY MAINTAINING METHOD

(71) Applicant: Grace Connection Microelectronics Limited, Zhubei (TW)

(72) Inventors: Pei Wei Chen, Zhubei (TW); Fang-Ren Liao, Zhubei (TW); Po Huang Huang, Zhubei (TW)

(73) Assignee: GRACE CONNECTION MICROELECTRONICS LIMITED, Zhubei (TW)

( * ) Notice: Subject to any disclaimer, the term of this patent is extended or adjusted under 35 U.S.C. 154(b) by 0 days.

(21) Appl. No.: 17/103,895

(22) Filed: Nov. 24, 2020

(65) Prior Publication Data
US 2021/0328592 A1    Oct. 21, 2021

(30) Foreign Application Priority Data
Nov. 21, 2019  (TW) ................. 108142346

(51) Int. Cl.
*H03D 3/24*  (2006.01)
*H03L 7/08*  (2006.01)
*H03L 7/099*  (2006.01)
*H03L 7/089*  (2006.01)

(52) U.S. Cl.
CPC .......... *H03L 7/0807* (2013.01); *H03L 7/0891* (2013.01); *H03L 7/099* (2013.01)

(58) Field of Classification Search
CPC ..... H03L 7/0807; H03L 7/099; H03L 7/0891; H03L 7/095; H03L 7/146; H03L 7/089; H03L 1/02; H03L 3/00; H04L 7/0083; H03D 13/004; G11B 20/1403
USPC ................. 375/373–376, 326, 327
See application file for complete search history.

(56) References Cited

U.S. PATENT DOCUMENTS

| | | | | | |
|---|---|---|---|---|---|
| 4,929,917 | A | * | 5/1990 | Yokogawa | G11B 20/1403 331/1 A |
| 6,133,797 | A | * | 10/2000 | Lovelace | H03L 7/095 331/17 |
| 7,312,645 | B1 | * | 12/2007 | Brunn | H04L 7/0083 327/147 |
| 7,940,088 | B1 | * | 5/2011 | Sampath | H03L 7/089 327/12 |
| 7,940,129 | B1 | * | 5/2011 | Tsang | H03L 1/02 331/17 |
| 8,098,788 | B1 | * | 1/2012 | Oner | H03L 7/146 375/376 |
| 9,160,352 | B1 | * | 10/2015 | Chen | H03L 3/00 |
| 2002/0084815 | A1 | * | 7/2002 | Murphy | H03D 13/004 327/157 |
| 2011/0304366 | A1 | * | 12/2011 | Kanda | H03L 7/0891 327/157 |

* cited by examiner

*Primary Examiner* — Phuong Phu
(74) *Attorney, Agent, or Firm* — Anna Tsang

(57) ABSTRACT

When digital input data disappear temporarily, within a counting period of the counter and pulse generator, an output voltage of the voltage generator rises, a threshold detector compares the output voltage of the voltage generator with a plurality of threshold values to generate a plurality of comparison results, and a logic gate unit generates a control signal according to the comparison results, to a charge pump, so that the charge pump controls the voltage-controlled oscillator to accelerate or decelerate.

18 Claims, 4 Drawing Sheets

CLOCK AND DATA RECOVERY CIRCUIT AND FREQUENCY MAINTAINING METHOD

CROSS REFERENCE

The present invention claims priority to TW 108142346, filed on Nov. 21, 2019.

BACKGROUND OF THE INVENTION

Field of Invention

The present invention relates to a clock and data recovery circuit and frequency maintaining method thereof.

Description of Related Art

Digital data may possibly have noise during high-speed transmission. Therefore, the transceiver usually needs a clock and data recovery circuit (CDR) to regenerate a low-jitter clock to recover low-noise data. Therefore, the clock and data recovery circuit is a key for transmitting and receiving data and clock.

Generally speaking, the clock is preferred to fill the requirements: 1. The clock frequency must be the same as the data rate; 2. There must be a correct phase correspondence between the clock and the data; 3. The clock can have little jitters at most.

The clock and data recovery circuit requires the generated clock to be locked in the digital input data when performing clock generation and data recovery. When the clock and data recovery circuit cannot receive the digit input data in a sudden period of time, the frequency of the generated clock can be easy to disorderly drift. When the clock and data recover circuit receives the digital input data again, the clock and data recovery circuit will take a long time to lock the generated clock in the digital input data again.

SUMMARY OF THE INVENTION

According to one embodiment of the present invention, a clock and data recovery circuit is provided, which includes: a phase detector; a first charge pump, coupled to the phase detector; a loop filter, coupled to the first charge pump; a voltage-controlled oscillator, coupled to the loop filter; a counter and pulse generator, coupled to the voltage-controlled oscillator; a voltage generator, coupled to the counter and pulse generator; a threshold detector, coupled to the voltage generator; a logic gate unit, coupled to the counter and pulse generator, and the threshold detector; and a second charge pump, coupled to the logic gate unit and the loop filter. When the clock and data recovery circuit continues receiving the digital input data, the phase detector, the first charge pump, the loop filter and the voltage-controlled oscillator make an output signal of the voltage-controlled oscillator lock in the digital input data. When the digital input data temporarily disappears, within a counting period of the counter and pulse generator, an output voltage of the voltage generator rises. The threshold detector compares the output voltage of the voltage generator separately with a plurality of threshold values, to generate a plurality of comparison results. According to the comparison results, the logic gate unit generates a control signal to the second charge pump, so that the second charge pump controls the voltage-controlled oscillator to accelerate or decelerate.

According to another embodiment of the present invention, a frequency maintaining method of a clock and data recovery circuit is proposed. The clock and data recovery circuit includes a voltage-controlled oscillator. The frequency maintaining method includes: when digital input data temporarily disappears, rising an output voltage within a counting period; comparing the output voltage separately with a plurality of threshold values to generate a plurality of comparison results; and generating a control signal according to the comparison results to control the voltage-controlled oscillator to accelerate or decelerate.

The objectives, technical details, features, and effects of the present invention will be better understood with regard to the detailed description of the embodiments below, with reference to the attached drawings.

DESCRIPTION OF THE PREFERRED EMBODIMENTS

According to the above and other objects, features, and benefits of the present invention, the following preferred embodiments, combined with the accompanying drawings, and detailed descriptions are as follows. Technical terms in this specification are referred to the most usual term explanations in the related field. However, when this specification describes or defines these terms, the definitions of these terms are subject to the description or definition therein. Each embodiment of the present invention has one or more technical features. Those skilled in the art can selectively implement some or all of the technical features in any embodiment, or selectively combine some or all of the technical features in these embodiments, which are within the scope of the present invention.

Figure 1:
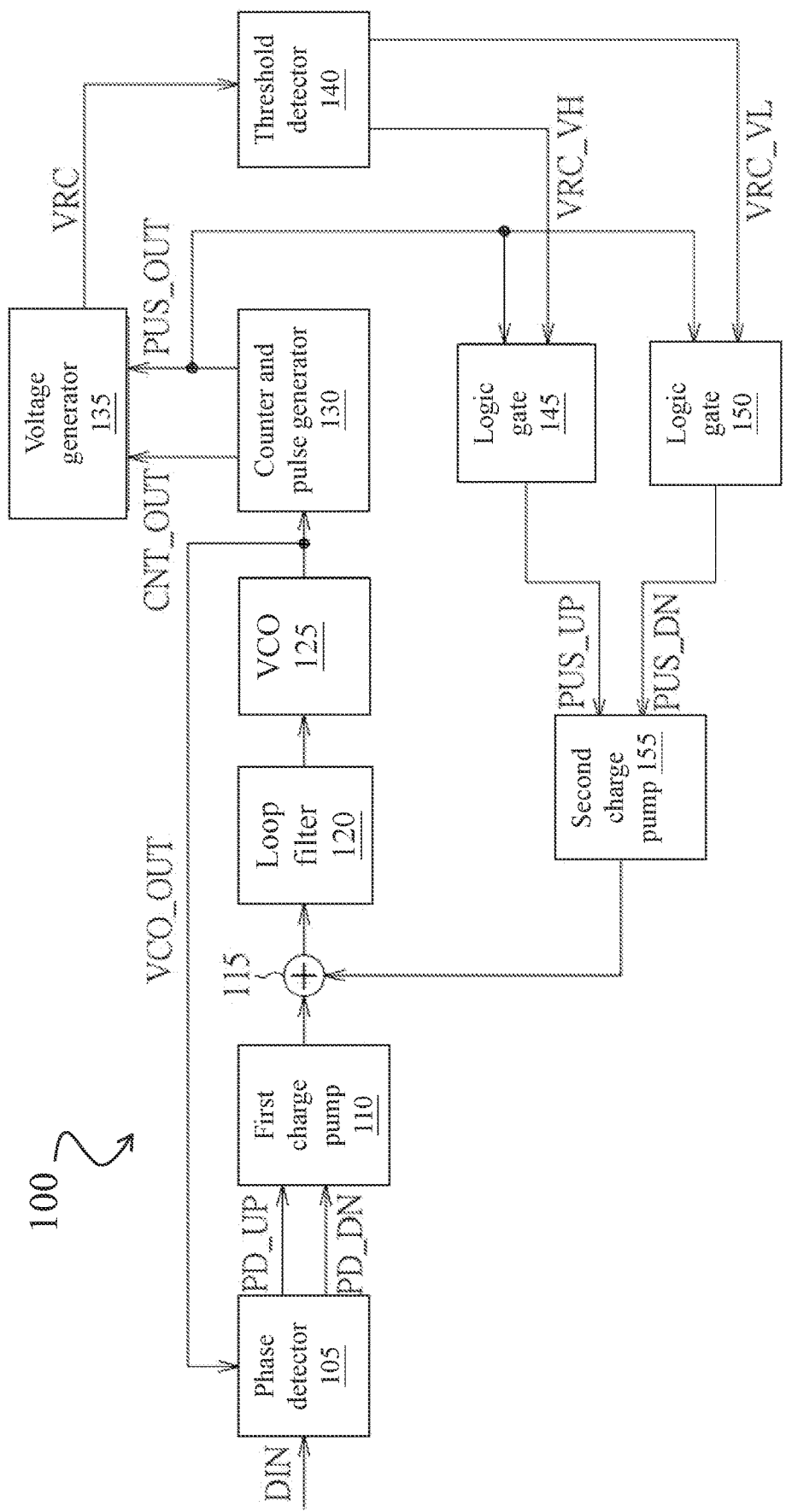
FIG. 1 shows a functional block diagram of the clock and data recovery circuit according to one embodiment of the present invention.

FIG. 1 shows a functional block diagram of a clock and data recovery circuit according to one embodiment of the present invention. As shown in FIG. 1, the clock and data recovery circuit 100 according to the embodiment of the present invention includes: a phase detector 105, a first charge pump 110, an adder 115, a loop filter 120, a voltage-controlled oscillator (VCO) 125, a counter and pulse generator 130, a voltage generator 135, a threshold detector 140, a first logic gate 145, a second logic gate 150 and a second charge pump 155. The first logic gate 145 and the second logic gate 150 can also be collectively referred to as a logic gate unit.

The phase detector 105 is configured to compare the phase of the digital input. data DIN with the phase of the output signal VCO_OUT of the voltage-controlled oscillator (VCO) 125, and generating an output signal PD_UP or PD_DN to the first charge pump 110 according to a phase difference between the digital input data DIN and the output signal VCO_OUT. In short, when the phase of the output signal VCO_OUT of the voltage-controlled oscillator (VCO) 125 lags behind the digital input data DIN, the phase detector 105 sends the output signal PD_UP to the first charge pump 110. When the output signal VCO_OUT or the voltage-controlled oscillator (VCO) 125 is ahead of the digital in data DIN, the phase detector 105 sends the output signal PD_DN to the first charge pump 110.

The first charge pump 110 is coupled to the phase detector 105. The first charge pump 110 has a charge power source and a discharge power source therein. When the first charge pump 110 receives the signal PD_UP from the phase detector 105, the first charge pump 110 will activate an internal charging power (or provides a charging path) output the charging current to the loop filter 120 (through the adder 115). Or, when the first charge pump 110 receives the signal PD_DN from the phase detector 105, the first charge pump 110 will activate an internal discharge power source (or provide a discharge path) to make the loop filter 120 discharge.

The adder 115 adds the signal s from the first charge pump 110 and the second charge pump 155, then provides the added signal to the loop filter 120. In other embodiments of the present invention, the adder 115 can be optional, and the signal of tune first charge pump 110 and the signal of the second charge pump 155 are respectively input to the loop filter 120 at the same time.

The loop filter 120 is coupled to the adder 115, the first charge pump 110, and the second charge pump 155. In other embodiments of the present invention, the adder 115 can be optional, and the loop filter 120 can also be directly coupled to the first charge pump 110 and the second charge pump 155 without passing through the adder 115. The loop filter 120 may be an RC circuit. When the loop filter 120 receives/connects the charging current/charging path provided by the first charge pump 110 and/or the second charge pump 155, the internal capacitor (not shown) of the loop filter 120 is charged, so that the DC voltage of the internal capacitor of the loop filter 120 rises. When the first charge pump 110 and/or the second charge pump 155 provides a discharge path to the loop filter 120, the internal capacitor of the loop filter 120 is discharged, so that the DC voltage of the internal capacitor of the loop filter 120 drops.

The voltage-controlled oscillator (VCO) 125 is coupled to the loop filter 120 to receive the DC voltage provided by the internal capacitor of the loop filter 120. When the DC voltage provided by the internal capacitor of the loop filter 120 to the voltage-controlled oscillator (VCO) 125 rises, a frequency of the output signal VCO_OUT of the voltage-controlled oscillator (VCO) 125 increases. Or, when the DC voltage provided by the internal capacitor of the loop filter 120 to the voltage-controlled oscillator 125 drops, the frequency of the output signal VCO_OUT of the voltage-controlled oscillator 125 drops.

A counter and pulse generator 130 is coupled to a voltage-controlled oscillator (VCO) 125 to receive the output signal VCO_OUT of the voltage-controlled oscillator (VCO) 125. The counter and pulse generator 130 provides a counting period CNT_OUT. For example, the width of the counting period CNT_OUT can be, but not limited to, 100 cycles of the output signal VCO_OUT of the voltage-controlled oscillator (VCO) 125; of course, the width of the counting period CNT_OUT in the present invention can be not limited hereto. When the counting period CNT_OUT is deactivated (for example, logic low), the counter and pulse generator 130 will also generate an output pulse PUS_OUT, where the width of the output pulse PUS_OUT is controllable.

The voltage generator 135 is coupled to the counter and pulse generator 130. The voltage generator 135 can generate a voltage VRC (also named as output. voltage VRC), which is related to the counting period CNT_OUT. For example, the voltage VRC is proportional to the counting period CNT_OUT. That is, the longer the counting period CNT_OUT is, the higher the voltage VRC will be. Or, the shorter the counting period CNT_OUT is, the lower the voltage VRC will be. The circuit details of voltage generator 135 are explained below.

The threshold detector 140 is coupled to the voltage generator 135. The threshold. detector 140 is configured to compare the voltage VRC generated by the voltage generator 135 separately with a first threshold value VH and a second threshold value VL to generate two comparison results VRC_VH and VRC_VL. When the voltage VRC is higher than the first threshold value VH, the comparison result VRC_VH is logic high. When the voltage VRC is lower than the second threshold value VL, the comparison result VRC_VL is logic high. The circuit details of the threshold detector 140 is explained below.

The first logic gate 145 is coupled to the counter and pulse generator 130, and the threshold detector 140. The first logic gate 145 can be, but not limited to, an AND logic gate. When the output pulse PUS_CUT and the comparison result VRC_VH are both logic high, the first logic gate 145 outputs a logic high signal PUS_UP. When either or both of the output pulse PUS_CUT and the comparison result VRC_VH are logic low, the first logic gate 145 outputs a logic low signal PUS_VH.

The second logic gate 150 is coupled to the counter and pulse generator 130, and the threshold detector 140. The second logic gate 150 can be, but not limited to, an AND logic gate. When the output pulse PUS_OUT and the comparison result VRC_VL are both logic high, the second logic gate 150 outputs a logic high signal PUS_DN. When either or both of the output pulse PUS_OUT and the comparison result VRC_VL are logic low, the second logic gate 150 outputs a logic low signal PUS_DN.

The second charge pump 155 is coupled to the first logic gate 145, the second logic gate 150, and the adder 115. When the signal PUS_UP is logic high, the second charge pump 155 provides a charging path to the loop filter 120. When the signal PUS_DN is logic low, the second charge pump 155 provides a discharge path to the loop filter 120.

In one embodiment, the width of the output pulse PUS_OUT is controllable. Therefore, when the width of the output pulse PUS_OUT is wider, the widths of the signals PUS_UP and PUS_DN are also wider, which will cause the second charge pump 155 to send more current to the loop filter 120 (or provide a longer discharge time for the loop filter 120) , so that the frequency of the output signal VCO_OUT of the voltage-controlled oscillator 125 has a relatively large adjustment range.

Figure 2:
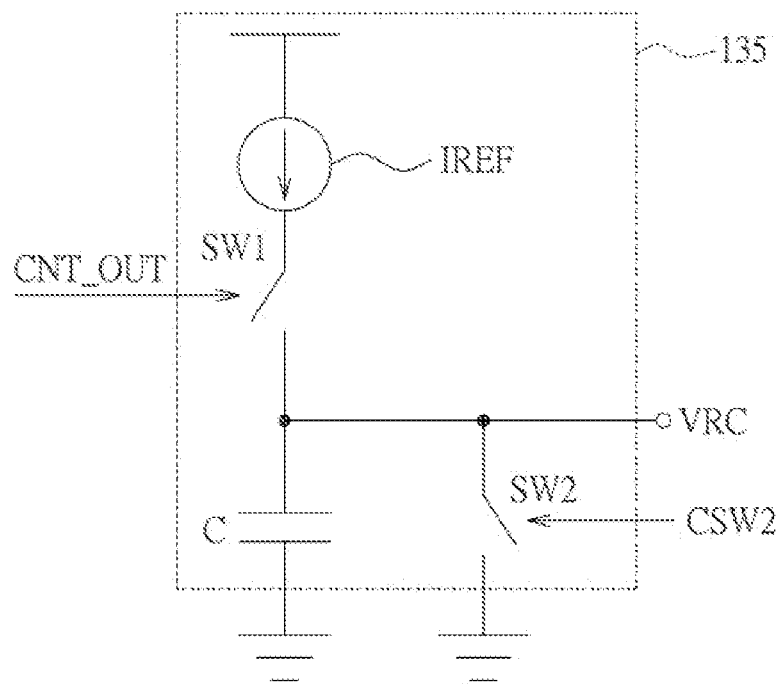
FIG. 2 shows a schematic circuit diagram of a voltage generator according to one embodiment of the present invention.

FIG. 2 shows a schematic circuit diagram of the voltage generator 135 according to one embodiment of the present invention. As shown in FIG. 2, the voltage generator 135 includes: a reference power supply IREF, switches SW1 and SW2, and a capacitor C. The switch SW1 is coupled between the reference power supply IREF and the capacitor C. The switch SW2 is coupled to the capacitor C.

The switch SW1 is controlled by the counting period CNT_OUT, and the switch SW2 is controlled by the control signal CSW2, wherein the control signal CSW2 is related to the output pulse PUS_OUT and counting period CNT_OUT. For example, CSW2=(CNT_OUT+PUS_OUT). For another example, when the counting period CNT_OUT is logic high, the switch SW1 is conducted. Or, when the counting period CNT_OUT is logic low, the switch SW1 is not conducted. For yet another example, when the control signal CSW2 is logic high, the switch SW2 is conducted. Or, when the control signal CSW2 is logic low, the switch SW2 is not conducted.

When logic high in the counting period CNT_OUT, the switch SW1 is conducted, so that the reference power supply IREF charges the capacitor C. In other words, when the width of the counting period CNT_OUT is wider, the cross voltage VRC of the capacitor C is higher (because the charging time is longer). Or, when the width of the counting period CNT_OUT is shorter, the cross voltage VRC of the capacitor C is lower.

In addition, as mentioned above, when changing from logic high to logic low in the counting period CNT_OUT, the output pulse PUS_OUT is activated. When the output pulse PUS_OUT ends, the switch SW2 is conducted to reset the voltage VPC.

Figure 3:
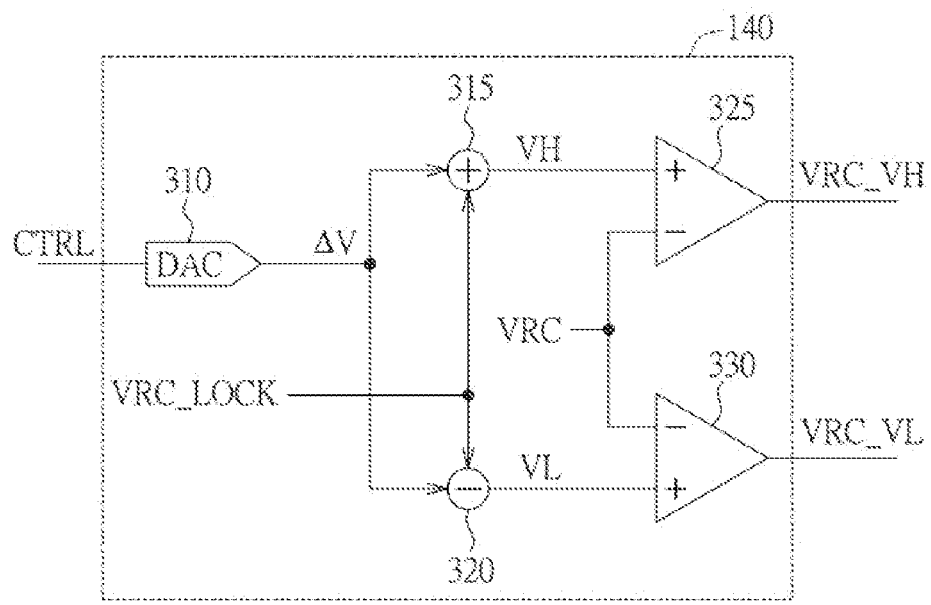
FIG. 3 shows a schematic circuit diagram of a threshold detector according to one embodiment of the present invention.

According to one embodiment of the present invention, FIG. 3 shows a schematic circuit diagram of the threshold detector 140. As shown in FIG. 3, the threshold detector 140 includes: a digital-to-analog converter (DAC) 310, an adder 315, a subtractor 320, and comparators 325 and 330. The digital-to-analog converter (DAC) 310 is coupled to the adder 315 and the subtractor 320. The adder 315 and the subtractor 320 are respectively coupled to the comparators 325 and 330.

The digital-to-analog converter (DAC) 310 converts a digital control signal CTRL into an analog voltage ΔV. The adder 315 adds the voltage VRC_LOCK (also named as the lock output voltage.) and the analog voltage ΔV, to generate the first threshold value VH (VH=VRC_LOCK+ΔV). The subtractor 320 subtracts the analog voltage ΔV from the voltage VRC_LOCK, to generate the second threshold value VL (VL=VRC_LOCK-ΔV). When the voltage-controlled oscillator (VCO) 125 is in a lock state, the voltage VRC generated by the voltage generator 135 is defined as the voltage VRC_LOCK.

The comparator 325 compares the voltage VRC with the first threshold value VH, to generate a comparison result VRC_VH. When. the voltage VRC is higher than the first threshold value VH, the comparison result VRC_VH of the comparator 325 is logic high. When the voltage VRC is lower than the first threshold value VH, the comparison result VRC_VH of the comparator 325 is logic low.

The comparator 330 compares the voltage VRC with the second threshold. value VL, to generate the comparison result VRC_VL. When. the voltage VRC is lower than the second threshold value VL, the comparison result VRC_VL of the comparator 330 is logic high. When the voltage VRC is higher than the second threshold value VL, the comparison result VRC_VL of the comparator 330 is logic low.

In case of continuously inputting the digital input data DIN to the clock and data recovery circuit 100, the clock and data recovery circuit 100 substantially operates by the phase detector 105, the first charge pump 110, the adder 115, the loop filter 120, and the voltage-controlled oscillator (VCO) 125, to let the output signal VCO_OUT of the voltage controlled oscillator (VCO) 125 lock in the digital input data DIN (that is, when the voltage-controlled oscillator 125 is in the lock state, the voltage VRC generated by the voltage generator 135 can be stably locked at the voltage VRC_LOCK, wherein the first threshold value VH and the second threshold value VL are generated accordingly). The detail of how to let the output signal VCO_OUT of the voltage-controlled oscillator (VCO) 125 be able to lock in the digital input data DIN, when continuously inputting the digital input data DIN to the clock and data recovery circuit 100, is not repeatedly explained herein. Of course, when the digital input data DIN is continuously input to the clock and data recovery circuit 100, the counter and pulse generator 130, the voltage generator 135, the threshold detector 140, the first logic gate 145, the second logic gate 150, and the second charge pump 155 can also work.

However, when the digital input data DIN temporarily disappears, and the clock and data recovery circuit 100 cannot receive the digital input data DIN for a while, the phase detector 105 and the first charge pump 110 cannot work. Therefore, when the digital input data DIN temporarily disappears, the output signal VCO_OUT of the voltage-controlled oscillator (VCO) 125 will disorderly drift, only by the operations of the phase detector 105, the first charge pump 110, the adder 115, the loop filter 120 and the voltage-controlled oscillator 125 (because there is no digital input data DIN can be referred to).

Therefore, in one embodiment, when the digital input data DIN temporarily disappears, by the counter and pulse generator 130, the voltage generator 135, the threshold detector 140, the first logic gate 145, the second logic gate 150 and the second charge pump 155, the frequency of the output signal VCO_OUT of the voltage-controlled oscillator (VCO) 125 can be maintained under a predetermined range, to reduce a frequency drift range of the output signal VCO_OUT of the voltage-controlled oscillator 125.

The detail of the operations of the counter and pulse generator 130, the voltage generator 135, the threshold detector 140, the first logic gate 145, the second logic gate 150, and the second. charge pump 155, when the digital input data DIN temporarily disappears, are detailed in later text.

Figures 4A, 4B:
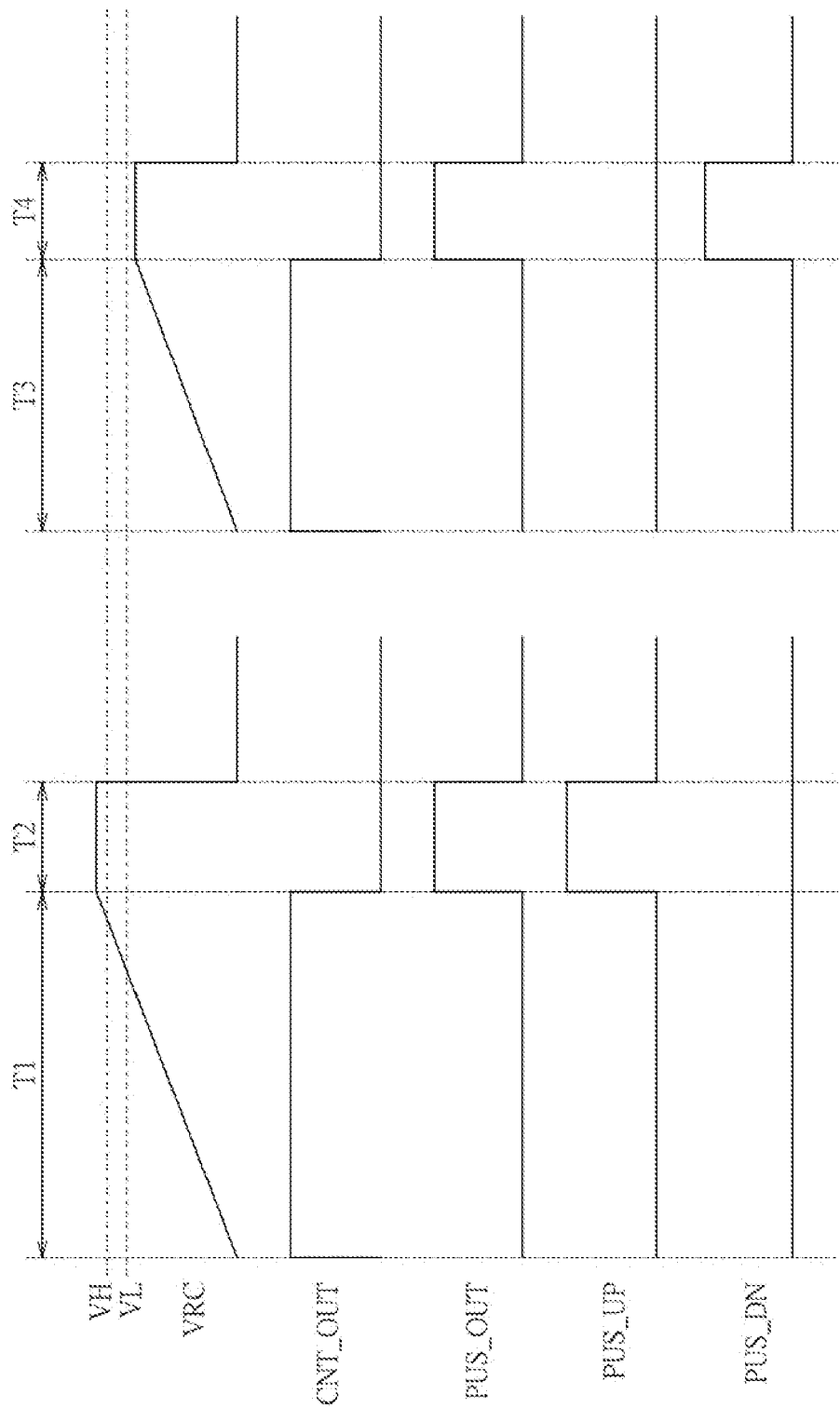
FIGS. 4A and 4B show the signal waveform diagrams according to one embodiment of the present invention.

Please refer to FIGS. 4A and 4B, wherein signal waveform diagrams according to one embodiment of the present invention are shown. In a period T1, due to the counting period CNT_OUT of logic high provided by the counter and pulse generator 130, the voltage generator 135 capacitor C is charged, so that the voltage VRC of the voltage generator 135 rises. When the period T1 ends and it enters a period T2, the counter and pulse generator 130 provides a counting period CNT_OUT of logic low, to make the capacitor C of the voltage generator stop charging, so that the voltage VRC of the voltage generator 135 is maintained. In the period T2, the threshold detector 140 compares the voltage VRC generated by the voltage generator 135 separately with the first threshold value VH and. the second threshold value VL, to generate two comparison results VRC_VH and VRC_VL, respectively. In FIG. 4A, since the voltage VRC is higher than the first threshold value VH and not lower than the second threshold value VL, therefore, the threshold detector 140 generates a logic high comparison result VRC_VH and a logic low VRC_VL in the period T2. In the period T2, since the comparison result VRC_VH and the output pulse PUS_OUT are both logic high, therefore, the first logic gate 145 generates a. logic high signal PUS_UP. The comparison result VRC_VL is logic low but the output pulse PUS_OUT is logic high. The second logic gate 150 generates a logic low signal PUS_DN. The signal PUS_UP of logic high is input to the second charge pump 155, so that the second charge pump 155 provides the charging path to the loop filter 120, to accelerate the voltage-controlled oscillator 125. As shown in FIG. 4A, since the voltage-controlled oscillator 125 is slower (voltage-controlled oscillator 125 is slower, which means that the output signal VCO_OUT of the voltage-controlled oscillator 125 has a lower frequency, and vice versa), which makes the counting period CNT_OUT longer (the charging time for voltage VRC is longer), so that the voltage VRC is higher than the first threshold value VH. In this embodiment, it can generate the signal PUS_UP to accelerate voltage-controlled oscillator (VCO) 125.

Similarly, in a period T3, since the counter and pulse generator 130 provides a logic high counting period CNT_OUT, the capacitor C of the voltage generator 135 is charged, so that the voltage VRC of the voltage generator 135 rises. When the period T3 ends and enters a period T4, the counter and pulse generator 130 provides a logic low counting period CNT_OUT, and the capacitor C of the voltage generator 135 is no longer charged, so that the voltage VRC of the voltage generator 135 is maintained. In the period T4, the threshold detector 140 compares the voltage VRC generated by the voltage generator 135 separately with the first threshold value VH and the second threshold value VL, to generate two comparison results VRC_VH and VRC_VL, respectively. In FIG. 4B, since the voltage VRC is not higher than the first threshold value VH and lower than the second threshold value VL, therefore, the threshold detector 140 generates a logic low comparison result VRC_VH and a logic high VRC_VL in the period T4. In the period T4, the comparison result VRC_VH is logic low and the output pulse PUS_OUT is logic high, and the first logic gate 145 generates a logic low signal PUS_UP; and the comparison result VRC_VL is logic high and the output pulse PUS_OUT is also logic high, so that the second logic gate 150 generates the signal PUS_DN of logic high. The logic high signal PUS_DN is input to the second charge pump 155, so that the second charge pump 155 provides a discharge path to the loop filter 120 to decelerate the voltage-controlled oscillator 125. In other words, as shown in FIG. 4B, because the voltage-controlled oscillator 125 is faster, the counting period CNT_OUT is shorter (the charging time for the voltage VRC is shorter). Therefore, the voltage VRC is lower than the second threshold value VL. According to the embodiment of the present invention, it can generate the signal PUS_DN to decelerate the voltage-controlled oscillator 125.

In one embodiment, when the counting period CNT_OUT ends, the voltage VRC of the voltage generator 135 is between the first threshold value VH and the second threshold value VL, the first logic gate 145 generates a logic low signal PUS_UP, and the second logic gate 150 generates a logic low signal PUS_DN. Therefore, the second charge pump 155 does not provide a charging path nor a discharge path to the loop filter 120. Therefore, the voltage-controlled oscillator 125 can maintain the frequency of the output signal VCO_OUT.

Figure 5:
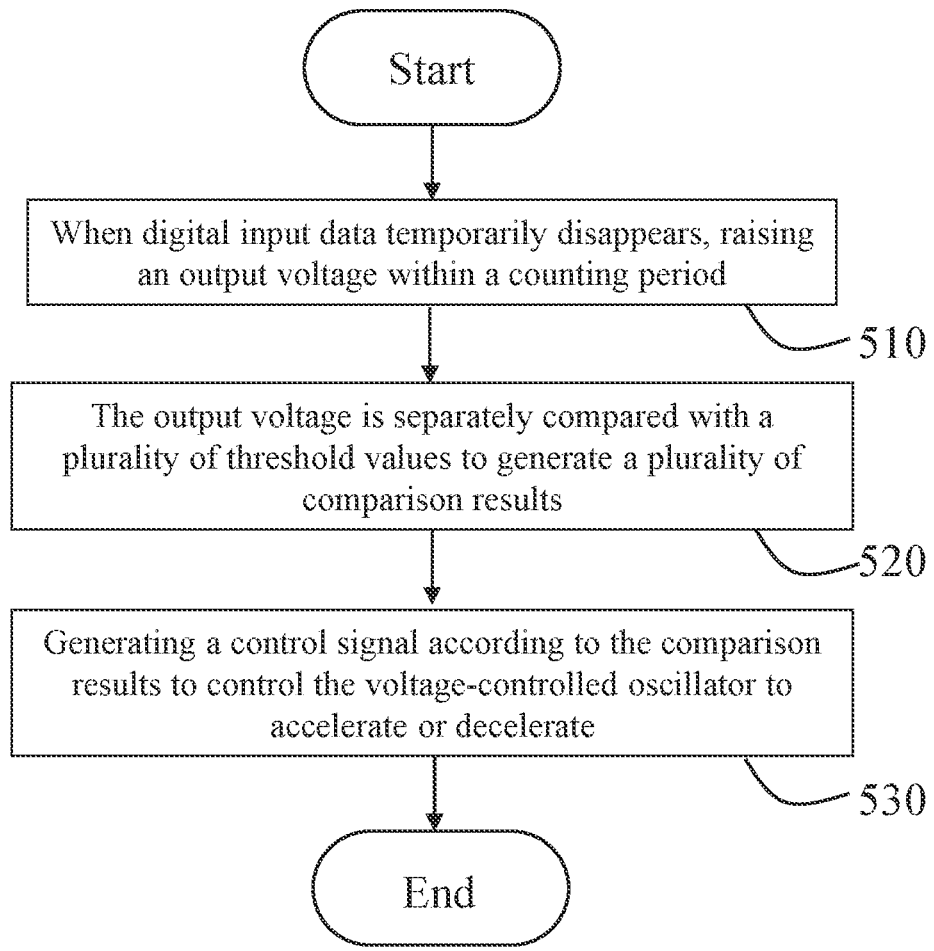
FIG. 5 shows a flowchart of the frequency maintaining method of the clock and data recovery circuit according to one embodiment of the present invention.

FIG. 5 shows a flowchart of the frequency maintaining method of the clock and data recovery circuit according to one embodiment of the present invention. In step 510, when digital input data temporarily disappears, raising an output voltage within a counting period. In step 520, the output voltage is separately compared with a plurality of threshold values to generate a plurality of comparison results. In step 530, generating a control signal according to the comparison results to control the voltage-controlled oscillator to accelerate or decelerate.

According to the present invention, even when the digital input data DIN cannot be received temporarily, the embodiments of the present invention can still effectively maintain the frequency of the output signal VCO_OUT of the voltage-controlled oscillator 125, so that the frequency of the output signal VCO_OUT will not disorderly drift.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention.

What is claimed is:

1. A. clock and data recovery circuit, comprising:
   a phase detector;
   a first charge pump, coupled to the phase detector;
   a loop filter, coupled to the first charge pump;
   a voltage-controlled oscillator, coupled to the loop filter;
   a counter and pulse generator, coupled to the voltage-controlled oscillator;
   a voltage generator, coupled to the counter and pulse generator;
   a threshold detector, coupled to the voltage generator;
   a logic gate unit, coupled to the counter and pulse generator, and the threshold detector;
   a second charge pump, coupled to the logic gate unit and the loop filter;
   wherein, when the clock and data recovery circuit continuously receives digital input data, the phase detector, the first charge pump, the loop filter and the voltage-controlled oscillator make an output signal of the voltage-controlled oscillator locked in the digital input data; and
   when the digital input data disappear temporarily, within a counting period of the counter and pulse generator, an output voltage of the voltage generator rises, the threshold detector compares the output voltage of the voltage generator with a plurality of threshold values to generate a plurality of comparison results, and the logic gate unit generates a control signal according to the comparison results, to the second charge pump, so that the second charge pump controls the voltage-controlled oscillator to accelerate or decelerate.

2. The clock and data recovery circuit of claim 1, wherein the counter and pulse generator receives the output signal of the voltage-controlled oscillator to provide the counting period, and a width of the counting period is related to the output signal of the voltage-controlled oscillator.

3. The clock and data recovery circuit of claim 2, wherein:
   the threshold detector respectively compares the output voltage of the voltage generator with a first threshold value and a second threshold value, to generate a first comparison result and a second comparison result;
   when the output voltage is higher than the first threshold value, the first comparison result is logic high; and
   when the output voltage is lower than the second threshold value, the second comparison result is logic high.

4. The clock and data recovery circuit of claim 3, wherein the logic gate unit includes a first logic gate and a second logic gate;
   when the output pulse and the first comparison result are both logic high, the first logic gate outputs a first signal of logic high to the second charge pump, so that the second charge pump controls the voltage-controlled oscillator to accelerate; and
   when the output pulse and the second comparison result are both logic high, the second logic gate outputs a second signal of logic high to the second charge pump, so that the second charge pump controls the voltage-controlled oscillator to decelerate.

5. The clock and data recovery circuit of claim 4, wherein the output voltage of the voltage generator is proportional to the counting period.

6. The clock and data recovery circuit of claim 5, wherein when the counting period of the counter and pulse generator ends, the counter and pulse generator further generate an output pulse, wherein during a logic high period of the output pulse, the output voltage of the voltage generator is maintained.

7. The clock and data recovery circuit of claim 6, wherein the clock and data recovery circuit, wherein a width of the output pulse is controllable.

8. The clock and. data recovery circuit of claim 6, wherein the voltage generator includes: a reference power supply, a first switch, a second switch, and a capacitor, wherein the first switch is coupled between the reference power supply and the capacitor, the second switch is coupled to the capacitor, and a voltage across the capacitor is the output voltage of the voltage generator;
the first switch is controlled during the counting period, and the second switch is controlled according to the output pulse and the counting period;
in response to logic high in the counting period, the first switch is conducted, so that the reference power supply charges the capacitor; and
in response to the end of the output pulse, the second switch is conducted, and the capacitor is discharged to reset the output voltage.

9. The clock and data recovery circuit of claim 8, wherein the threshold detector includes: a digital-to-analog converter (DAC), an adder, a subtractor, a first comparator and a second comparator, wherein the digital-to-analog converter (DAC) is coupled to the adder and the subtractor, and the adder and the subtractor are coupled to the first comparator and the second comparator;
wherein the digital-to-analog converter (DAC) converts a digital control signal into an analog voltage, and the adder adds a lock output voltage with the analog voltage to generate the first threshold value, and the subtractor subtracts the analog voltage from the lock output voltage to generate the second threshold value; and
wherein the first comparator compares the output voltage with the first threshold value to generate the first comparison result, and the second comparator compares the output voltage with the second threshold value to generate the second comparison result.

10. A frequency maintaining method of clock and data recovery circuit, wherein the clock and data recovery circuit includes a voltage-controlled oscillator, and the frequency maintaining method comprises:
when digital input data temporarily disappear, rising an output voltage within a counting period;
comparing the output voltage with a plurality of threshold values, to generate a plurality of comparison results; and
generating a control signal according to the comparison results, to control the voltage-controlled oscillator to accelerate or decelerate.

11. The frequency maintaining method of claim 10, wherein a width of the counting period is related to the output signal of the voltage-controlled oscillator.

12. The frequency maintaining method of claim 11, wherein:
respectively comparing the output. voltage with a first threshold value and a second threshold value, to generate a first comparison result and a second comparison result;
when the output voltage is higher than the first threshold value, the first comparison result is logic high; and
when the output voltage is lower than the second threshold value, the second comparison result is logic high.

13. The frequency maintaining method of claim 12, wherein:
when the output pulse and the first comparison result are both logic high, outputting a first signal of logic high to a second charge pump of the clock and data recovery circuit, so that the second charge pump controls the voltage-controlled oscillator to accelerate; and
when the output pulse and the second comparison result are both logic high, a second signal of logic high is output to the second charge pump, so that the second charge pump controls the voltage-controlled oscillator to decelerate.

14. The frequency maintaining method of claim 13, wherein the output voltage is proportional to the counting period.

15. The frequency maintaining method of claim 14, wherein when the counting period ends, an output pulse is generated; and during a logic high of the output pulse, the output voltage is maintained.

16. The frequency maintaining method of claim 15, wherein a width of the output pulse is controllable.

17. The frequency maintaining method of claim 15, wherein:
in response to logic high in the counting period, a reference power supply charges a capacitor, and a voltage across the capacitor is the output voltage of the voltage generator; and
in response to the end of the output pulse, the capacitor is discharged to reset the output voltage.

18. The frequency maintaining method of claim 17, wherein;
converting a digital control signal into an analog voltage, and adding a lock output voltage with the analog voltage to generate the first threshold value;
subtracting the analog voltage from the lock output voltage to generate the second threshold value;
comparing the output voltage with the first threshold value to generate the first comparison result, and comparing the output voltage with the second threshold value to generate the second comparison result.

* * * * *